United States Patent
Shiraishi et al.

(10) Patent No.: US 7,542,242 B2
(45) Date of Patent: Jun. 2, 2009

(54) FPC WITH VIA HOLES WITH FILLER BEING WELDED TO SUSPENSION AND DRIVE APPARATUS

(75) Inventors: Masashi Shiraishi, Kwai Chung (HK); Hiroyoshi Nakajima, Kwai Chung (HK); Ichiro Yagi, Kwai Chung (HK)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 705 days.

(21) Appl. No.: 10/959,429

(22) Filed: Oct. 7, 2004

(65) Prior Publication Data

US 2005/0078416 A1    Apr. 14, 2005

(30) Foreign Application Priority Data

Oct. 10, 2003    (JP) .............................. 2003/352245

(51) Int. Cl.
G11B 5/48    (2006.01)
(52) U.S. Cl. ................................... 360/245.9
(58) Field of Classification Search ............. 360/244.7, 360/245.3, 245.4, 245.5, 245.6, 245.9, 246.2, 360/246.4, 266.3, 245.8
See application file for complete search history.

(56) References Cited

U.S. PATENT DOCUMENTS

| | | | | |
|---|---|---|---|---|
| 5,012,368 A | * | 4/1991 | Bosier et al. ............. | 360/264.2 |
| 5,754,368 A | * | 5/1998 | Shiraishi et al. .......... | 360/245.9 |
| 5,838,519 A | * | 11/1998 | Takizawa et al. ......... | 360/245.9 |
| 6,181,526 B1 | * | 1/2001 | Summers .................. | 360/245.9 |
| 6,305,785 B1 | * | 10/2001 | Hosaka et al. ............ | 347/49 |
| 6,667,857 B2 | * | 12/2003 | Kamigama et al. ....... | 360/245.9 |
| 6,700,747 B2 | * | 3/2004 | Matz ....................... | 360/245.9 |
| 7,137,187 B2 | * | 11/2006 | Pan et al. ................. | 29/603.03 |

FOREIGN PATENT DOCUMENTS

| | | |
|---|---|---|
| JP | 09-128727 | 5/1997 |
| JP | 09-128728 | 5/1997 |
| JP | 2002-092834 | 3/2002 |

* cited by examiner

*Primary Examiner*—Tianjie Chen
(74) *Attorney, Agent, or Firm*—Frommer Lawrence & Haug LLP

(57) ABSTRACT

A suspension includes a flexure constituted by a metal plate member, for supporting a head slider provided with at least one head element, a load beam provided with a top end section and constituted by a metal plate member, for supporting the flexure at the top end section, and an individual FPC member attached to the flexure and the load beam and provided with trace conductors to be electrically connected to the at least one head element of the head slider. The FPC member includes a plurality of via holes provided with metal fillers filled therein, the metal fillers in the respective via holes are welded to the flexure and/or the load beam, and the FPC member is fixed to the flexure and/or the load beam at least by means of the welding.

39 Claims, 4 Drawing Sheets

FPC WITH VIA HOLES WITH FILLER BEING WELDED TO SUSPENSION AND DRIVE APPARATUS

PRIORITY CLAIM

This application claims priority from Japanese patent application No. 2003-352245, filed on Oct. 10, 2003, which is incorporated herein by reference.

BACKGROUND OF THE INVENTION

1. Field of the Invention

The present invention relates to a suspension for supporting a flying type head slider with a head element such as a magnetic head element or an optical head element, to a head gimbal assembly (HGA) with the suspension, and to a disk drive apparatus with the HGA.

2. Description of the Related Art

Japanese patent publication Nos. 09128727 A2 and 09128728 A2 disclose a suspension used in a hard disk drive (HDD) apparatus and provided with a lead-conductor integrated flexure for mounting a magnetic head slider and a load beam. This lead-conductor integrated flexure is fabricated by forming integrally a thin-film lead conductor on a metal flexure. The lead-conductor integrated flexure is laser-welded to the load beam.

However, according to such suspension structure described in these Japanese patent publications, because the lead-conductor integrated flexure itself is expensive, it is impossible to reduce the manufacturing cost of the suspension and also the HGA.

Japanese patent publication No. 2002092834 A2 discloses a suspension provided with a low cost small flexure, a load beam laser-welded to the flexure, and a normal flexible printed circuit board (FPC) member used in typical electric components, adhered to the flexure and the load beam by a resin adhesive, without using the above-mentioned lead-conductor integrated flexure.

According to the suspension structure described in the latter Japanese patent publication, because both the flexure and the FPC member are low cost, the manufacturing cost of the suspension and the HGA can be greatly reduced. However, since it is necessary to fix the FPC member to the flexure and the load beam only by the resin adhesive, there occurs difficulty in spreading control of the resin adhesive. Also, because the magnetic head slider is mounted on the FPC member, it is difficult to ground the body of the slider.

BRIEF SUMMARY OF THE INVENTION

It is therefore an object of the present invention to provide a high-performance suspension, an HGA and a disk drive apparatus with the HGA, which can be fabricated in low cost by a simple manufacturing process.

According to the present invention, a suspension includes a flexure constituted by a metal plate member, for supporting a head slider provided with at least one head element, a load beam provided with a top end section and constituted by a metal plate member, for supporting the flexure at the top end section, and an individual FPC member attached to the flexure and the load beam and provided with trace conductors to be electrically connected to the at least one head element of the head slider. In particular, according to the present invention, the FPC member includes a plurality of via holes provided with metal fillers filled therein, the metal fillers in the respective via holes are welded to the flexure and/or the load beam, and the FPC member is fixed to the flexure and/or the load beam at least by means of the welding.

Also, according to the present invention, an HGA with the above-mentioned suspension and the head slider is provided. Furthermore, a disk drive apparatus with at least one HGA is provided.

The low cost and small metal flexure and the low cost FPC member used in typical electric components are adopted without using an expensive lead-conductor integrated flexure. Thus, the manufacturing cost can be extremely reduced. Also, since the metal fillers filled in the via holes formed in the FPC member are welded to the flexure and/or the load beam, no adhesive fixing of the FPC member to the flexure and/or the load beam is needed. Thus, no problem in spreading control of the adhesive occurs resulting the manufacturing process to become greatly simple. Furthermore, grounding of the head slider mounted on the FPC member that was difficult in the conventional art can be easily achieved.

It is preferred that the plurality of via holes include at least one first via hole provided with a metal filler filled therein for grounding the head slider.

It is also preferred that the plurality of via holes include at least one first via hole located at a top end section of the FPC member and provided with a metal filler filled therein. In this case, more preferably, the metal filler filled in the at least one first via hole is welded to the flexure.

It is preferred that the FPC member includes a plurality of connection pads containing head element connection pads for the at least one head element of the head slider, and that the at least one first via hole is a single first via hole provided with a metal filler filled therein and located forward of the plurality of connection pads. In this case, more preferably, the plurality of connection pads includes a ground connection pad for grounding the head slider, and the ground connection pad is grounded through the metal filler filled in the single first via hole.

It is also preferred that the plurality of via holes include a plurality of second via holes located at a middle section and a rear end section of the FPC member and provided with metal fillers filled therein. In this case, more preferably, the metal fillers filled in the plurality of second via holes are welded to the load beam.

It is further preferred that the metal fillers filled in the plurality of via holes are made of Cu or Ni.

It is preferred that the metal fillers filled in the plurality of via holes have exposed surfaces from the via holes, and wherein the exposed surfaces are covered by a metal material capable of laser welding. More preferably, the metal material capable of laser welding is Ni.

It is also preferred that the FPC member is fixed to the flexure and/or the load beam only by the welding of the metal fillers filled in the plurality of via holes to the flexure and/or the load beam, or that the FPC member is fixed to the flexure and/or the load beam by the welding of the metal fillers filled in the plurality of via holes to the flexure and/or the load beam and by adhering of the FPC member to the flexure and/or the load beam. In the latter case of the combined use of the welding and the adhering, the amount of the adhesive used is less than that used when the FPC member is fixed to the flexure and/or the load beam by the adhesive only. Thus, no problem in spreading control of the adhesive will occur.

Further objects and advantages of the present invention will be apparent from the following description of the preferred embodiments of the invention as illustrated in the accompanying drawings.

DETAILED DESCRIPTION OF THE INVENTION

Figure 1:
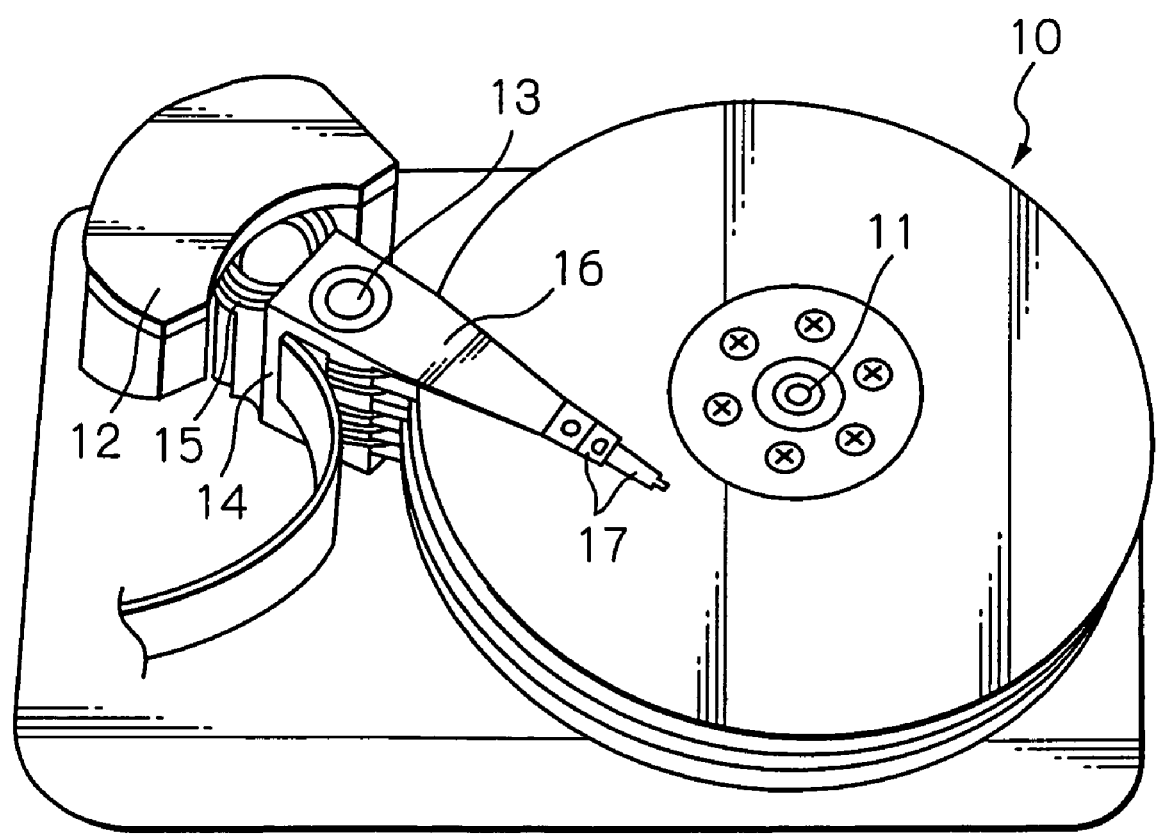
FIG. 1 is an oblique view schematically illustrating main components of an HDD apparatus in a preferred embodiment according to the present invention.

In FIG. 1, reference numeral 10 denotes a plurality of magnetic hard disks rotating around an axis 11, and 12 denotes an assembly carriage device for positioning each magnetic head slider on a track of each disk. The assembly carriage device 12 is mainly constituted by a carriage 14 capable of rotating around an axis 13 and an actuator 15 such as for example a voice coil motor (VCM) for driving the carriage 14 to rotate.

Base sections at one ends of a plurality of drive arms 16 stacked along the axis 13 are attached to the carriage 14, and one or two HGAs 17 are mounted on a top section at the other end of each arm 16. Each of the HGAs 17 has a magnetic head slider mounted at its top end section so that the slider opposes to one surface, that is recording and reproducing surface, of each of the magnetic disks 10.

Figure 2:
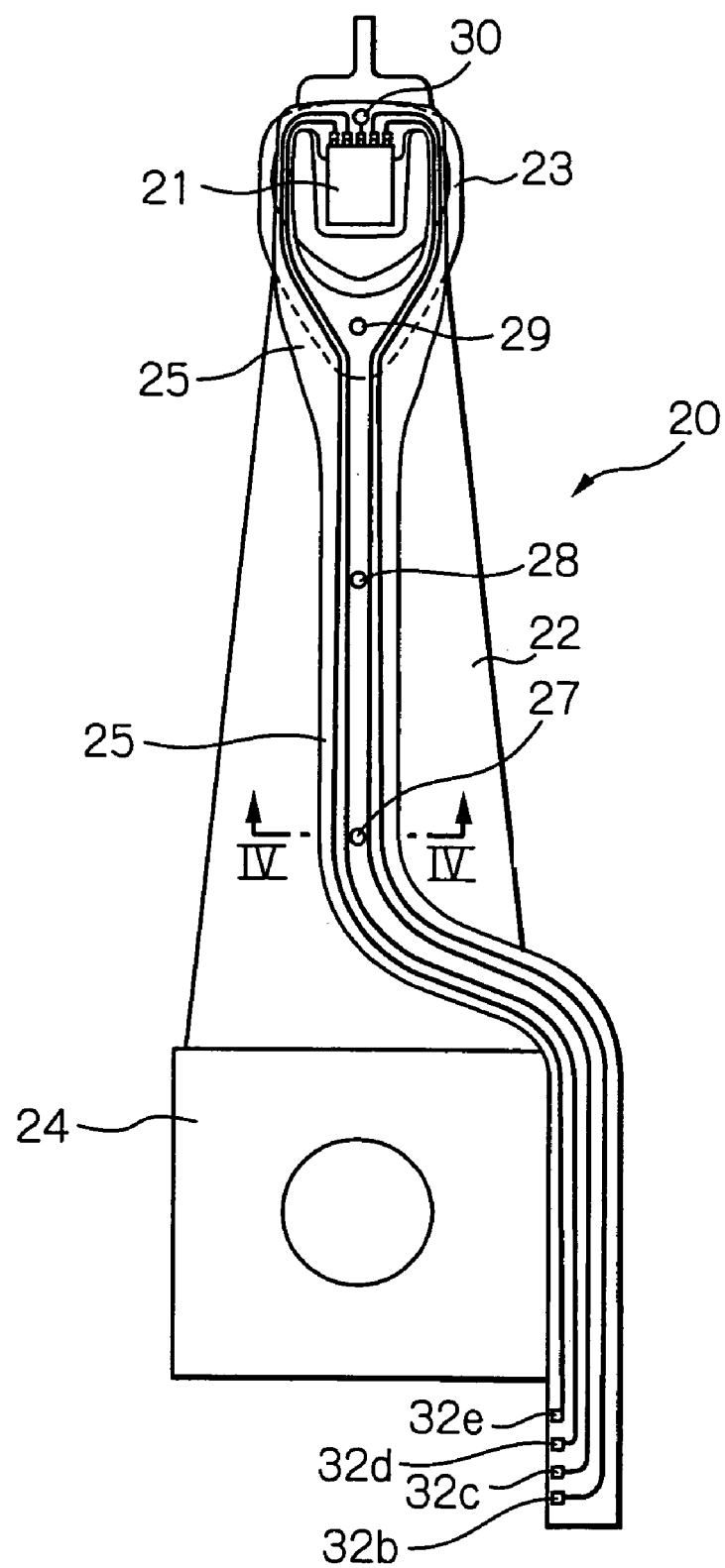
FIG. 2 is an oblique view illustrating the whole structure of an HGA in the embodiment of FIG. 1.
Figure 3:
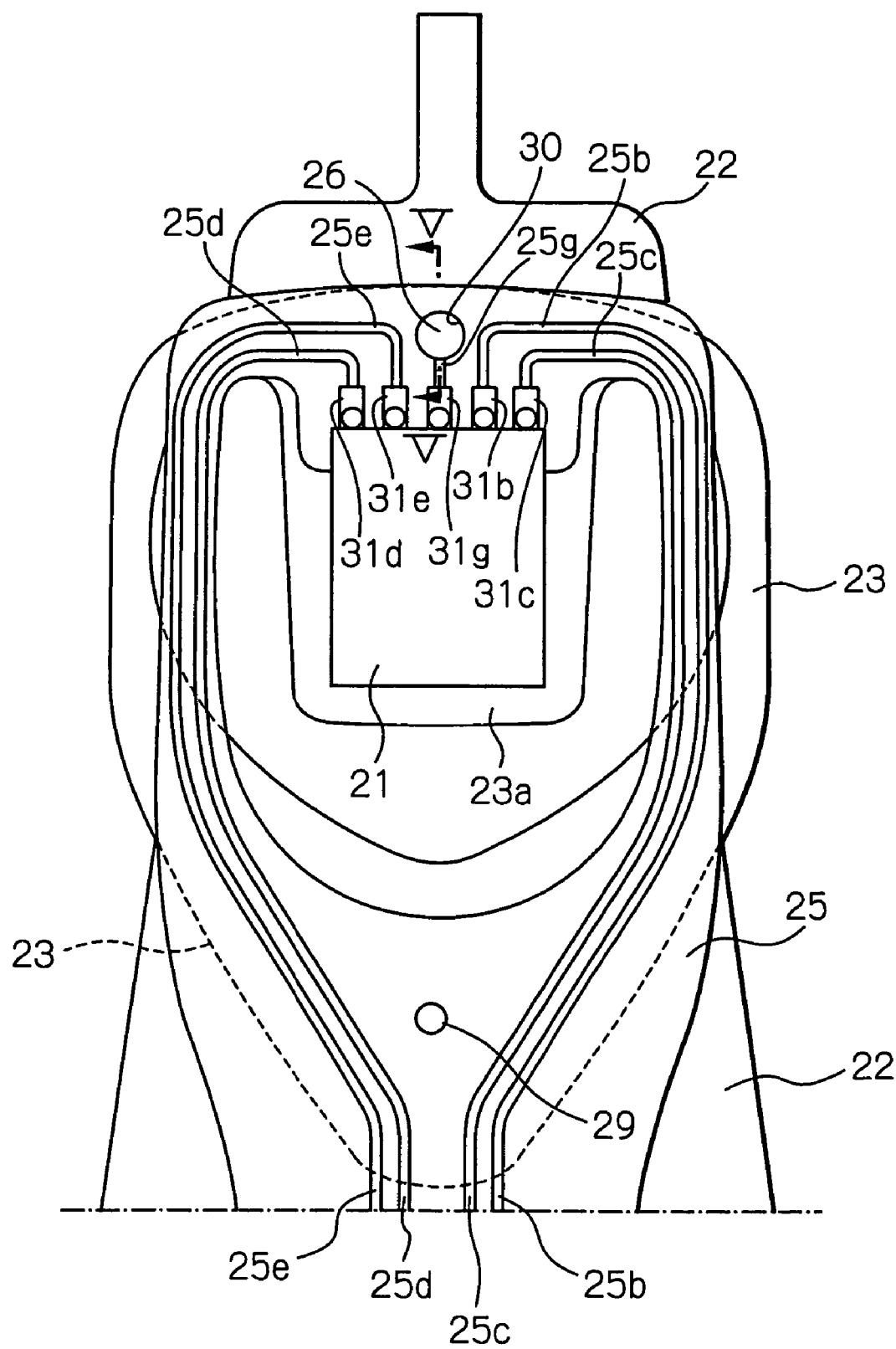
FIG. 3 is an enlarged plane view illustrating a top end section of the HGA in the embodiment of FIG. 1.

As shown in FIGS. 2 and 3, the HGA is assembled by fixing a magnetic head slider 21 with a thin-film magnetic head element to a top end section of a suspension 20.

The suspension 20 is substantially configured by a load beam 22, a resilient flexure 23 coupled with a top end section of the load beam 22, a base plate 24 fixed to a rear end section of the load beam 22, and a lead conductor member or a FPC member 25.

The load beam 22 has elasticity for producing a load force for pressing the magnetic head slider 21 toward the direction of a magnetic disk surface through the flexure 23 in operation. The load beam 22 is made of in this embodiment a resilient stainless steel plate such as for example SUS304TA.

The flexure 23 has a flexible tongue 23a depressed by a dimple (not shown) formed on the load beam 22. On the tongue 23a, fixed is the magnetic head slider 21 through the FPC member 25. The flexure 23 is made of in this embodiment a stainless steel plate such as for example SUS304TA to have elasticity for supporting flexibly the magnetic head slider 21 by this tongue 23a. The flexure 23 is fixed with the load beam 22 at a plurality of points by pinpoint welding.

The base plate 24 is made of in this embodiment a stainless steel or iron plate and fixed to the base section of the load beam 22 by welding. This base plate 24 is attached to the drive arm 16 shown in FIG. 1.

Figure 4:
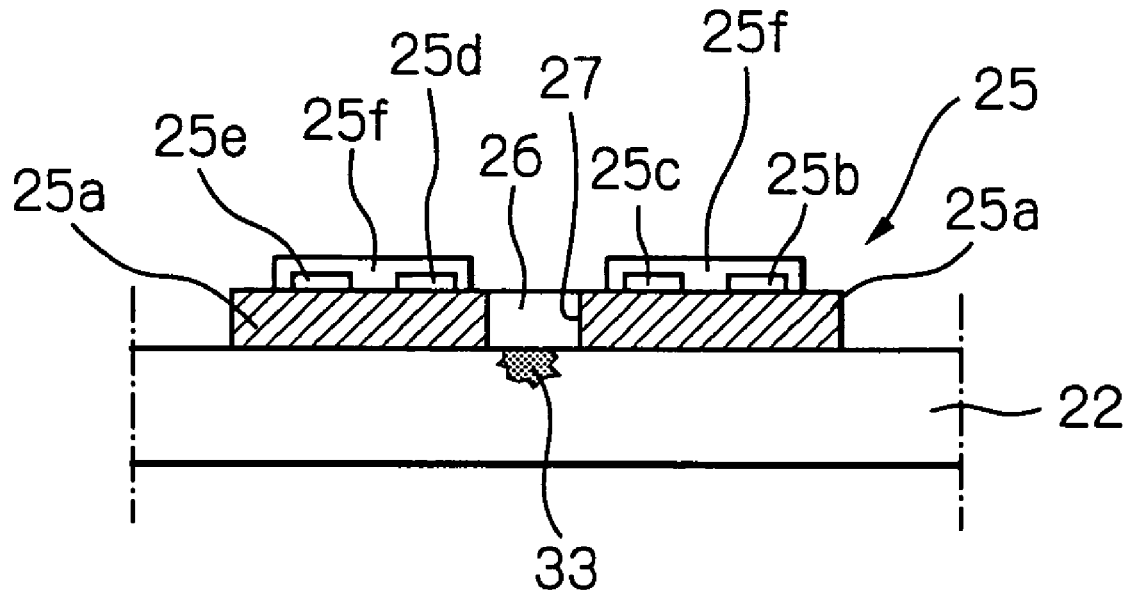
FIG. 4 is a sectional view seen from a IV-IV line shown in FIG. 3.

On the load beam 22 and the flexure 23, an individual FPC member 25 with the same structure as that used in typical electric components is fixed. The FPC member 25 has a sectional structure, as shown in FIG. 4, with a base insulation layer 25a made of a resin material such as polyimide, patterned trace conductors 25b-25e formed on the base insulation layer 25a, and an overcoat insulation layer 25f made of a resin material such as polyimide for covering the trace conductors 25b-25e.

One ends of the trace conductors 25b-25e are electrically connected to head element connection pads 31b-31e formed at a top end section of the FPC member 25, respectively. The connection pads 31b-31e are electrically connected with terminal electrodes of the magnetic head slider by gold ball bonding or solder ball bonding for example. The other ends of the trace conductors 25b-25e are electrically connected to external circuit connection pads 32b-32e formed at a rear end section of the FPC member 25, respectively.

As shown in FIGS. 2 to 5, in this embodiment, particularly, a plurality of via holes 27-30 filled with metal fillers 26 of for example copper (Cu) or nickel (Ni) are formed in the FPC member 25. The metal fillers 26 filled in the via holes 27-30 are laser-beam welded as shown by reference numeral 33 to the flexure 23 or the load beam 22 so as to fix the FPC member 25 to the flexure 23 and the load beam 22. The exposed surface of each metal filler 26 is covered by a metal material such as Ni, which is capable of laser welding.

Figure 5:
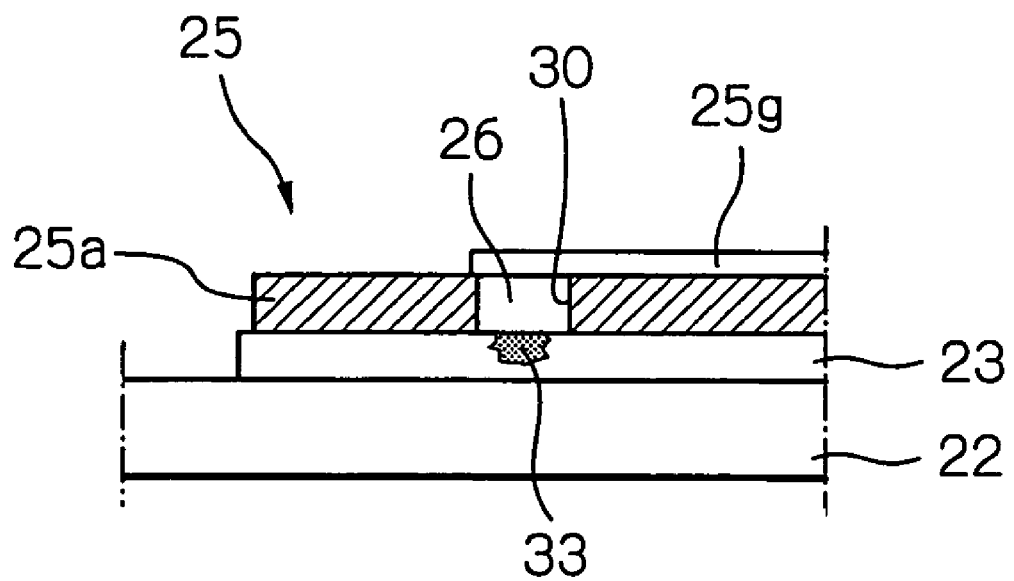
FIG. 5 is a sectional view seen from a V-V line shown in FIG. 3.

More concretely, in the middle section and the rear end section of the FPC member 25, the plurality of via holes 27 and 28 are formed. The metal fillers 26 filled in the via holes 27 and 28 are laser-welded to the load beam 22. Also, in the top end section of the FPC member 25, the plurality of via holes 29 and 30 are formed. The metal fillers 26 filled in the via holes 29 and 30 are laser-welded to the flexure 23. Particularly, the metal filler 26 in the via hole 30 is located forward of the head element connection pads 31b-31e and electrically connected to, through a ground trace conductor 25g, a ground connection pad 31g that is directly connected to the end surface of the magnetic head slider 21 (FIGS. 3 and 5). This via hole 30 filled with the metal filler 26 can easily achieve grounding of the magnetic head slider 21 even if the FPC member is used and the magnetic head slider 21 is mounted on the FPC member.

As aforementioned, according to this embodiment, because the low cost and small metal flexure 23 and the low cost FPC member 25 used in typical electric components are adopted without using an expensive lead-conductor integrated flexure, the manufacturing cost can be extremely reduced. Also, since the metal fillers 26 filled in the via holes 27-30 formed in the FPC member 25 are welded to the flexure 23 and the load beam 22, no adhesive fixing of the FPC member 25 to the flexure 23 and the load beam 22 is needed. Thus, no problem in spreading control of the adhesive occurs resulting the manufacturing process to become greatly simple. Furthermore, grounding of the magnetic head slider 21 mounted on the FPC member 25 can be easily achieved through the metal filler 26 in the via hole 30, the ground trace conductor 25g and the ground connection pad 31g.

In the above-mentioned embodiment, fixing of the FPC member 25 to the flexure 23 and/or the load beam 22 is performed only by the welding of the metal fillers 26 filled in the via holes 27-30 to the flexure 23 and/or the load beam 22. However, it is possible to perform a combined use of the welding of the metal fillers 26 filled in the via holes 27-30 to the flexure 23 and/or the load beam 22, and the adhering of the FPC member 25 with the flexure 23 and/or the load beam 22. In the latter case of the combined use of the welding and the adhering, the amount of the adhesive used is less than that used when the FPC member 25 is fixed to the flexure 23 and/or the load beam 22 by the adhesive only. Thus, no problem in spreading control of the adhesive will occur.

A structure of the suspension according to the present invention is not limited to the aforementioned structure.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A suspension comprising:
   a flexure constituted by a metal plate member, for supporting a head slider provided with at least one head element;
   a load beam provided with a top end section and constituted by a metal plate member, for supporting said flexure at the top end section; and
   an individual flexible printed circuit board member attached to said flexure and said load beam and provided with trace conductors to be electrically connected to said at least one head element of said head slider,
   said flexible printed circuit board member including a plurality of via holes provided with metal fillers filled therein, said metal fillers in the respective via holes being welded to said flexure and/or said load beam, said flexible printed circuit board member being fixed to said flexure and/or said load beam at least by means of the welding.

2. The suspension as claimed in claim 1, wherein said plurality of via holes include at least one first via hole provided with a metal filler filled therein for grounding said head slider.

3. The suspension as claimed in claim 1, wherein said plurality of via holes include at least one first via hole located at a top end section of said flexible printed circuit board member and provided with a metal filler filled therein.

4. The suspension as claimed in claim 3, wherein said metal filler filled in said at least one first via hole is welded to said flexure.

5. The suspension as claimed in claim 3, wherein said flexible printed circuit board member includes a plurality of connection pads containing head element connection pads for said at least one head element of said head slider, and wherein said at least one first via hole is a single first via hole provided with a metal filler filled therein and located forward of said plurality of connection pads.

6. The suspension as claimed in claim 5, wherein said plurality of connection pads includes a ground connection pad for grounding said head slider, and wherein said ground connection pad is grounded through the metal filler filled in said single first via hole.

7. The suspension as claimed in claim 1, wherein said plurality of via holes include a plurality of second via holes located at a middle section and a rear end section of said flexible printed circuit board member and provided with metal fillers filled therein.

8. The suspension as claimed in claim 7, wherein said metal fillers filled in said plurality of second via holes are welded to said load beam.

9. The suspension as claimed in claim 1, wherein said metal fillers filled in said plurality of via holes are made of Cu or Ni.

10. The suspension as claimed in claim 1, wherein said metal fillers filled in said plurality of via holes have exposed surfaces from the via holes, and wherein said exposed surfaces are covered by a metal material capable of laser welding.

11. The suspension as claimed in claim 10, wherein said metal material capable of laser welding is Ni.

12. The suspension as claimed in claim 1, wherein said flexible printed circuit board member is fixed to said flexure and/or said load beam only by the welding of said metal fillers filled in said plurality of via holes to said flexure and/or said load beam.

13. The suspension as claimed in claim 1, wherein said flexible printed circuit board member is fixed to said flexure and/or said load beam by the welding of said metal fillers filled in said plurality of via holes to said flexure and/or said load beam and by adhering of said flexible printed circuit board member to said flexure and/or said load beam.

14. A head gimbal assembly comprising:
   a head slider provided with at least one head element;
   a flexure constituted by a metal plate member, for supporting said head slider;
   a load beam provided with a top end section and constituted by a metal plate member, for supporting said flexure at the top end section; and
   an individual flexible printed circuit board member attached to said flexure and said load beam and provided with trace conductors electrically connected to said at least one head element of said head slider,
   said flexible printed circuit board member including a plurality of via holes provided with metal fillers filled therein, said metal fillers in the respective via holes being welded to said flexure and/or said load beam, said flexible printed circuit board member being fixed to said flexure and/or said load beam at least by means of the welding.

15. The head gimbal assembly as claimed in claim 14, wherein said plurality of via holes include at least one first via hole provided with a metal filler filled therein for grounding said head slider.

16. The head gimbal assembly as claimed in claim 14, wherein said plurality of via holes include at least one first via hole located at a top end section of said flexible printed circuit board member and provided with a metal filler filled therein.

17. The head gimbal assembly as claimed in claim 16, wherein said metal filler filled in said at least one first via hole is welded to said flexure.

18. The head gimbal assembly as claimed in claim 16, wherein said flexible printed circuit board member includes a plurality of connection pads containing head element connection pads electrically connected to said at least one head element of said head slider, and wherein said at least one first via hole is a single first via hole provided with a metal filler filled therein and located forward of said plurality of connection pads.

19. The head gimbal assembly as claimed in claim 18, wherein said plurality of connection pads includes a ground connection pad for grounding said head slider, and wherein said ground connection pad is grounded through the metal filler filled in said single first via hole.

20. The head gimbal assembly as claimed in claim 14, wherein said plurality of via holes include a plurality of second via holes located at a middle section and a rear end section of said flexible printed circuit board member and provided with metal fillers filled therein.

21. The head gimbal assembly as claimed in claim 20, wherein said metal fillers filled in said plurality of second via holes are welded to said load beam.

22. The head gimbal assembly as claimed in claim 14, wherein said metal fillers filled in said plurality of via holes are made of Cu or Ni.

23. The head gimbal assembly as claimed in claim 14, wherein said metal fillers filled in said plurality of via holes have exposed surfaces from the via holes, and wherein said exposed surfaces are covered by a metal material capable of laser welding.

24. The head gimbal assembly as claimed in claim 23, wherein said metal material capable of laser welding is Ni.

25. The head gimbal assembly as claimed in claim 14, wherein said flexible printed circuit board member is fixed to said flexure and/or said load beam only by the welding of said metal fillers filled in said plurality of via holes to said flexure and/or said load beam.

26. The head gimbal assembly as claimed in claim 14, wherein said flexible printed circuit board member is fixed to said flexure and/or said load beam by the welding of said metal fillers filled in said plurality of via holes to said flexure and/or said load beam and by adhering of said flexible printed circuit board member to said flexure and/or said load beam.

27. A disk drive apparatus with at least one head gimbal assembly, said at least one head gimbal assembly comprising:
a head slider provided with at least one head element;
a flexure constituted by a metal plate member, for supporting said head slider;
a load beam provided with a top end section and constituted by a metal plate member, for supporting said flexure at the top end section; and
an individual flexible printed circuit board member attached to said flexure and said load beam and provided with trace conductors electrically connected to said at least one head element of said head slider,
said flexible printed circuit board member including a plurality of via holes provided with metal fillers filled therein, said metal fillers in the respective via holes being welded to said flexure and/or said load beam, said flexible printed circuit board member being fixed to said flexure and/or said load beam at least by means of the welding.

28. The disk drive apparatus as claimed in claim 27, wherein said plurality of via holes include at least one first via hole provided with a metal filler filled therein for grounding said head slider.

29. The disk drive apparatus as claimed in claim 27, wherein said plurality of via holes include at least one first via hole located at a top end section of said flexible printed circuit board member and provided with a metal filler filled therein.

30. The disk drive apparatus as claimed in claim 29, wherein said metal filler filled in said at least one first via hole is welded to said flexure.

31. The disk drive apparatus as claimed in claim 29, wherein said flexible printed circuit board member includes a plurality of connection pads containing head element connection pads electrically connected to said at least one head element of said head slider, and wherein said at least one first via hole is a single first via hole provided with a metal filler filled therein and located forward of said plurality of connection pads.

32. The disk drive apparatus as claimed in claim 31, wherein said plurality of connection pads includes a ground connection pad for grounding said head slider, and wherein said ground connection pad is grounded through the metal filler filled in said single first via hole.

33. The disk drive apparatus as claimed in claim 27, wherein said plurality of via holes include a plurality of second via holes located at a middle section and a rear end section of said flexible printed circuit board member and provided with metal fillers filled therein.

34. The disk drive apparatus as claimed in claim 33, wherein said metal fillers filled in said plurality of second via holes are welded to said load beam.

35. The disk drive apparatus as claimed in claim 27, wherein said metal fillers filled in said plurality of via holes are made of Cu or Ni.

36. The disk drive apparatus as claimed in claim 27, wherein said metal fillers filled in said plurality of via holes have exposed surfaces from the via holes, and wherein said exposed surfaces are covered by a metal material capable of laser welding.

37. The disk drive apparatus as claimed in claim 36, wherein said metal material capable of laser welding is Ni.

38. The disk drive apparatus as claimed in claim 27, wherein said flexible printed circuit board member is fixed to said flexure and/or said load beam only by the welding of said metal fillers filled in said plurality of via holes to said flexure and/or said load beam.

39. The disk drive apparatus as claimed in claim 27, wherein said flexible printed circuit board member is fixed to said flexure and/or said load beam by the welding of said metal fillers filled in said plurality of via holes to said flexure and/or said load beam and by adhering of said flexible printed circuit board member to said flexure and/or said load beam.

* * * * *